United States Patent
Hsu et al.

(10) Patent No.: US 9,059,715 B2
(45) Date of Patent: Jun. 16, 2015

(54) VOLTAGE LEVEL SHIFT WITH INTERIM-VOLTAGE-CONTROLLED CONTENTION INTERRUPT

(75) Inventors: Steven K. Hsu, Lake Oswego, OR (US);
Vinod Sannareddy, Austin, TX (US);
Amit Agarwal, Hillsboro, OR (US);
Feroze A. Merchant, Austin, TX (US);
Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,584

(22) PCT Filed: Nov. 14, 2011

(86) PCT No.: PCT/US2011/060637
§ 371 (c)(1),
(2), (4) Date: Jun. 24, 2013

(87) PCT Pub. No.: WO2013/074073
PCT Pub. Date: May 23, 2013

(65) Prior Publication Data
US 2013/0271199 A1   Oct. 17, 2013

(51) Int. Cl.
*H03L 5/00* (2006.01)
*H03K 19/0185* (2006.01)
*H03K 3/356* (2006.01)

(52) U.S. Cl.
CPC .......... *H03L 5/00* (2013.01); *H03K 19/018507* (2013.01); *H03K 3/356182* (2013.01)

(58) Field of Classification Search
CPC ................ H03K 19/018521; H03K 19/00315; H03K 19/09441; H03K 19/017509

USPC ................................. 327/333; 326/62, 80, 81
See application file for complete search history.

(56) References Cited

U.S. PATENT DOCUMENTS 6,563,357 B1   5/2003   Hsu et al.
7,501,875 B1   3/2009   Chen et al.
(Continued)

FOREIGN PATENT DOCUMENTS

WO   2010074976 A2   7/2010
WO   2013074073 A1   5/2013

OTHER PUBLICATIONS

International Search Report and Written Opinion received for Patent Application No. PCT/US2011/060637, mailed on Aug. 24, 2012, 9 pages.
(Continued)

*Primary Examiner* — John Poos
(74) *Attorney, Agent, or Firm* — Garrett IP, LLC

(57) ABSTRACT

Methods and systems to implement voltage level shifting with interim-voltage-controlled contention-interruption. A voltage level shifter (VLS) may include voltage level shift circuitry to level shift an input logical state from an input voltage swing to an output voltage swing. The VLS may include contention circuitry, a contention interrupter, and an interrupt controller to generate a contention-interrupt control having an interim voltage swing. A lower limit of the interim voltage swing may correspond to a lower limit of the output voltage swing. An upper limit of the interim voltage swing may correspond to an upper limit of the input voltage swing. The VLS may be implemented to level shift true and complimentary logical states, such as with cascode voltage switch logic (CVSL). The interim-voltage-controlled contention interrupter may help to maintain voltages within process-based voltage reliability limits of the contention interrupter, with relatively little delay, and relatively little power and area consumption.

17 Claims, 11 Drawing Sheets

(56) References Cited

U.S. PATENT DOCUMENTS

2004/0246038 A1    12/2004    Bucossi
2008/0191777 A1*    8/2008    Lee et al. ............ 327/333
2008/0315936 A1*    12/2008    Mauthe et al. ............ 327/333

OTHER PUBLICATIONS

Office Action received for Chinese Patent Application No. 201220739217.0, mailed on Mar. 27, 2013, 5 pages of Office Action including 3 pages of English translation.

Rocha et al. "High Voltage Tolerant Level Shifters and Logic Gates in Standard Low Voltage CMOS Technologies", Jun. 2007, 4 pages.

Notice of Grant received for Chinese Patent Application No. 201220739217.0, mailed on Jun. 17, 2013, 3 pages of Grant including 1 page of English Translation.

International Preliminary Report on Patentability and Written Opinion received for PCT patent Application No. PCT/US2011/060637, mailed on May 30, 2014, 6 pages.

* cited by examiner

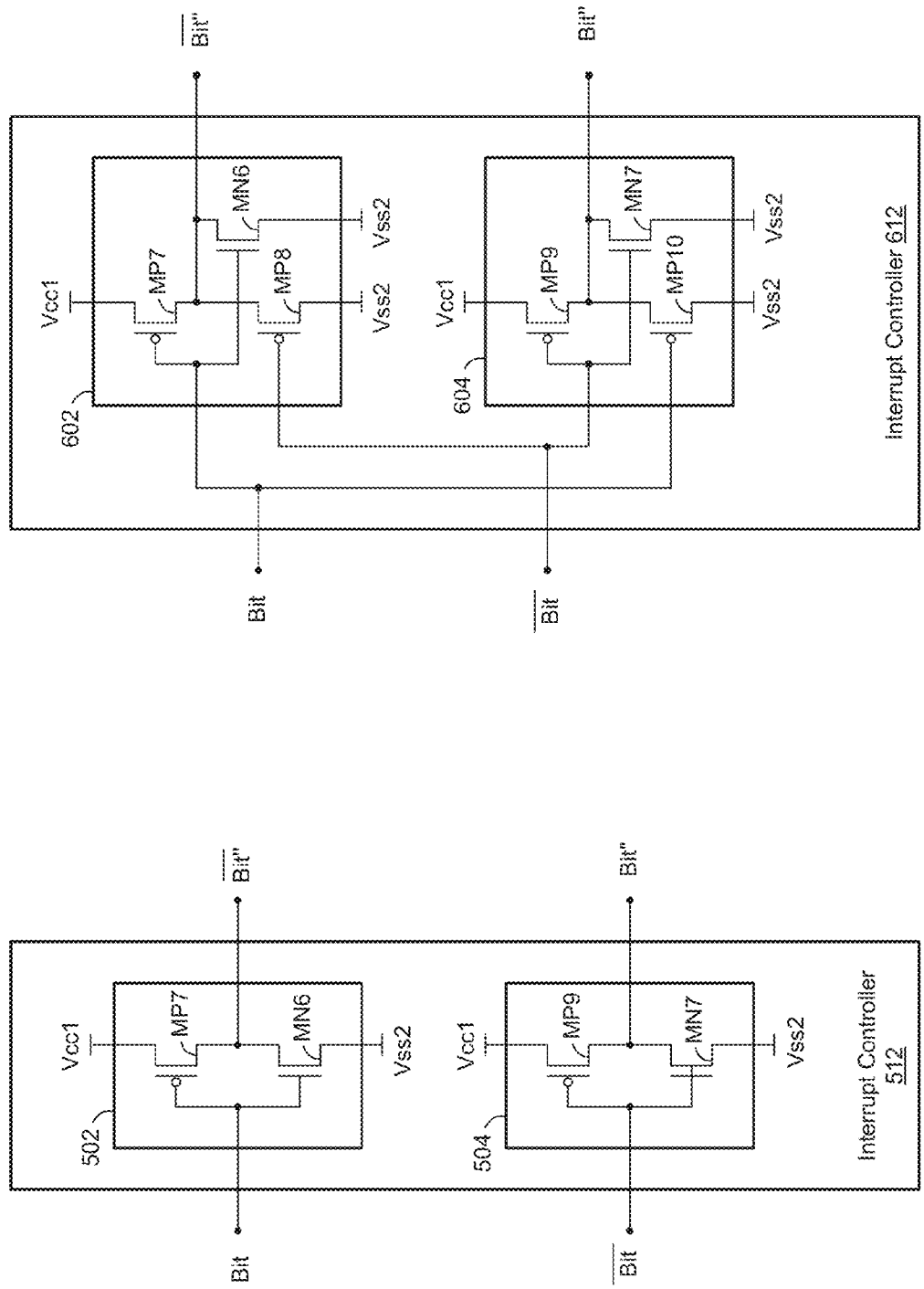

VOLTAGE LEVEL SHIFT WITH INTERIM-VOLTAGE-CONTROLLED CONTENTION INTERRUPT

BACKGROUND

Integrated circuits (ICs) may utilize a range of supply voltages and/or currents. Within each voltage domain, logical states 0 and 1 may be defined by upper and lower limits of corresponding operating voltages or voltage swings.

Where data is passed from a first voltage domain to a second voltage domain, the data may be translated from a voltage swing of the first voltage domain to a voltage swing of the second voltage domain to permit appropriate switching of logic levels and to avoid communication static in the second voltage domain.

Translation may be performed with a voltage level shift circuit, which may include cascode voltage switch logic (CVSL), and which may include differential cascode voltage switch logic (DCVSL).

Contention is inherent in a CVSL or DCVSL based voltage level shifter. Contention may increase when increasing differences between input and output voltages. Greater contention may increase delay and power consumption, and may impact operating function.

A voltage level shifter may include a contention interrupt circuit to control contention based on an input logical state. Where the input and output voltages differ significantly, process-based voltage reliability limits of the contention interrupt circuit may be exceeded. Tolerance to input and output voltage differences may be increased with increased interrupt transistor sizes, but at the potential expense of power consumption, and area consumption, and/or delay.

BRIEF DESCRIPTION OF THE DRAWINGS/FIGURES

FIG. 1 is a block diagram of a voltage level shifter, including voltage level shift circuitry to translate true and complimentary input logical states from an input voltage swing to an output voltage swing, a contention interrupter to interrupt contention within the voltage level shift circuitry, and an interrupt controller to translate the input true and complimentary logical states from the input voltage swing to an interim voltage swing to control the contention interrupter.

FIG. 5 is a circuit diagram of an interrupt controller including first and second inverters, each to output an inverted one of the input logical states at a corresponding one of a lower and upper limit of the interim voltage swing FIG. 6 is a circuit diagram of another interrupt controller including first and second inverters similar to those of FIG. 5, each further including an additional p-type transistor device to provide additional current drive to a corresponding n-type transistor device.

Figure 7:
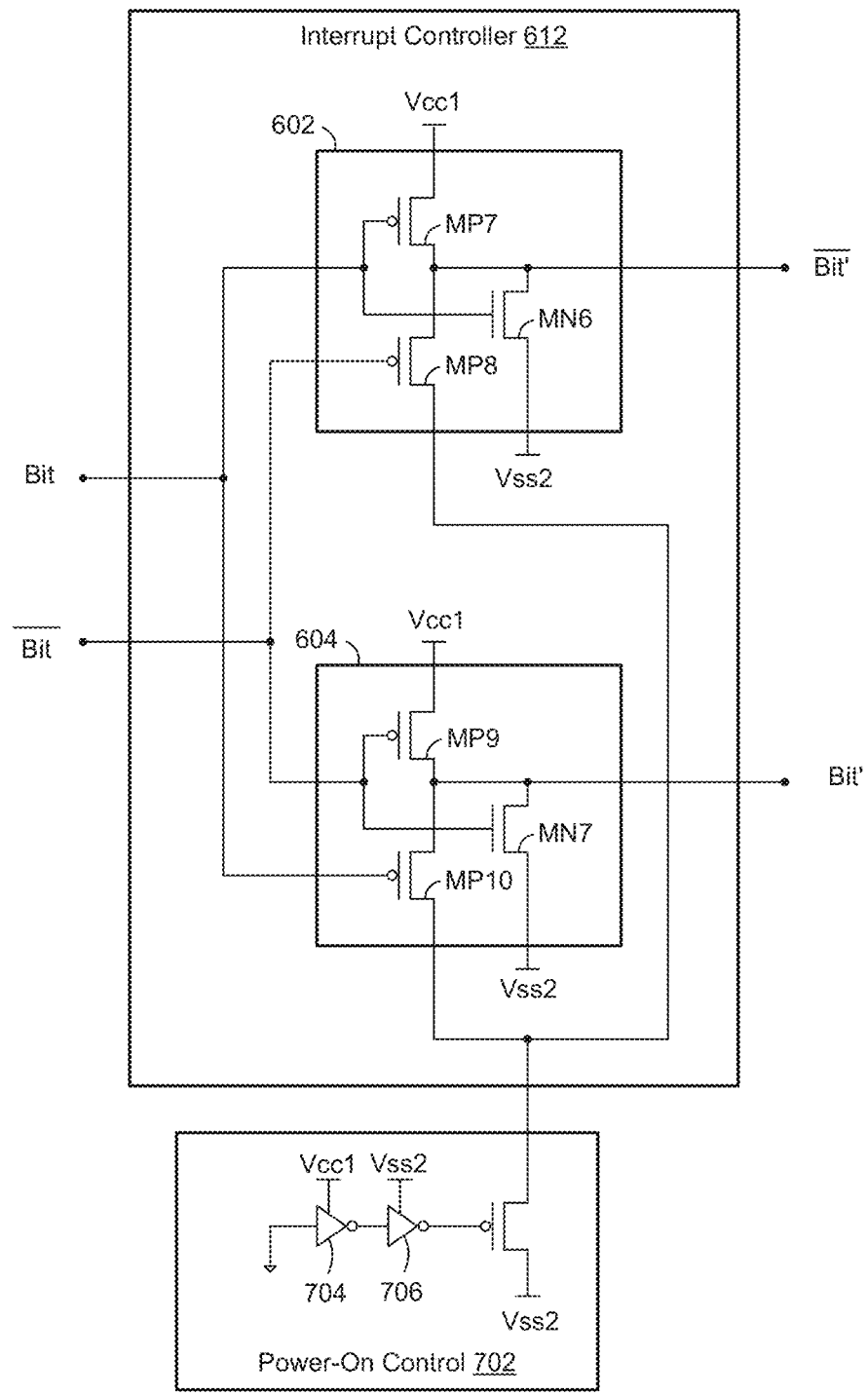

FIG. 7 is a circuit diagram of the interrupt controller of FIG. 6 and power-on control circuitry.

Figure 8:
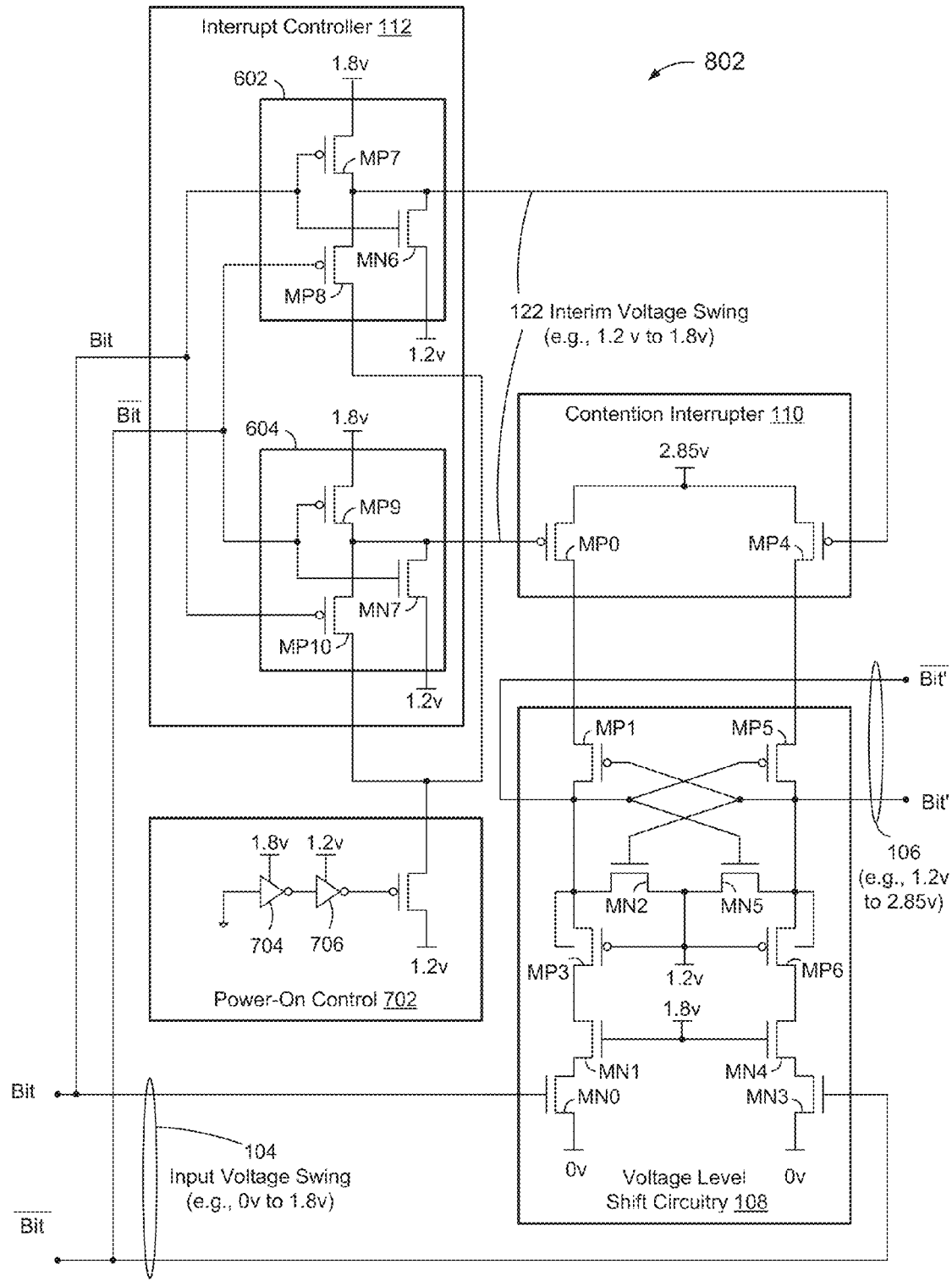

FIG. 8 is a circuit diagram of another voltage level shifter, including features described with reference to one of more of FIGS. 1 through 7, and example voltage levels and voltage swings for a level-shifting mode.

Figure 9:
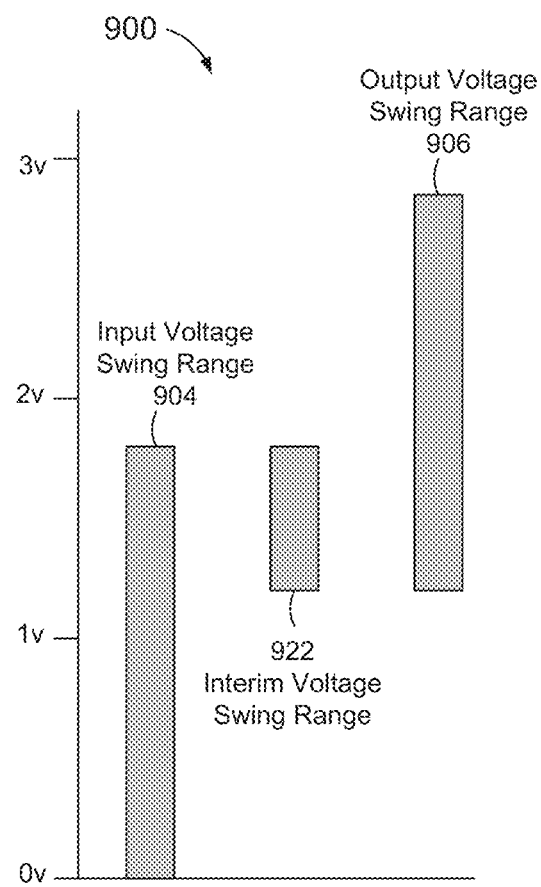

FIG. 9 is a chart to illustrate the example voltages and voltage swings voltages of FIG. 8.

Figure 10:
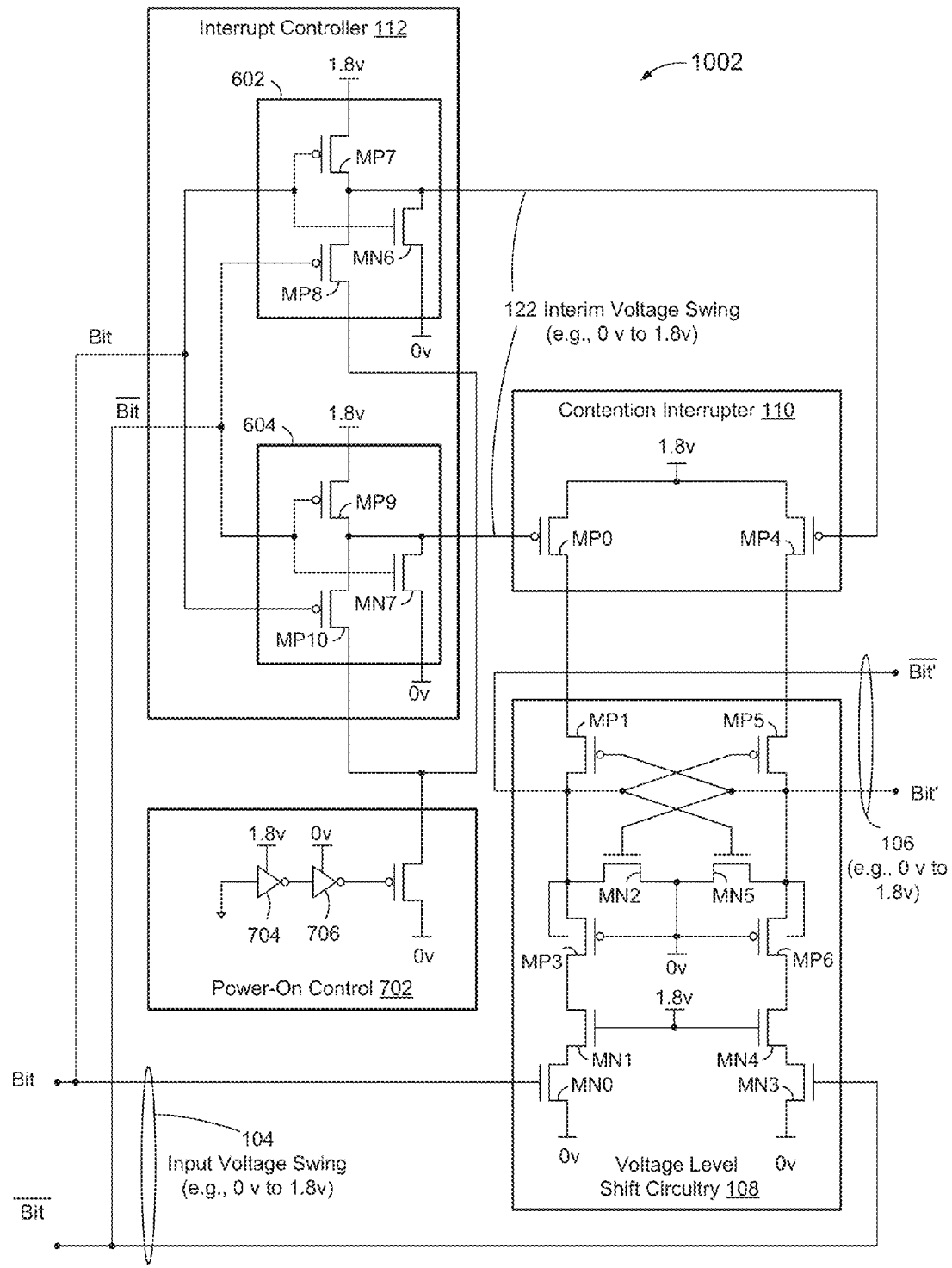

FIG. 10 is a circuit diagram of another voltage level shifter, including features described with respect to one of more of FIGS. 1 through 7, and example voltage levels and voltage swings for a non-level-shifting mode.

Figure 11:
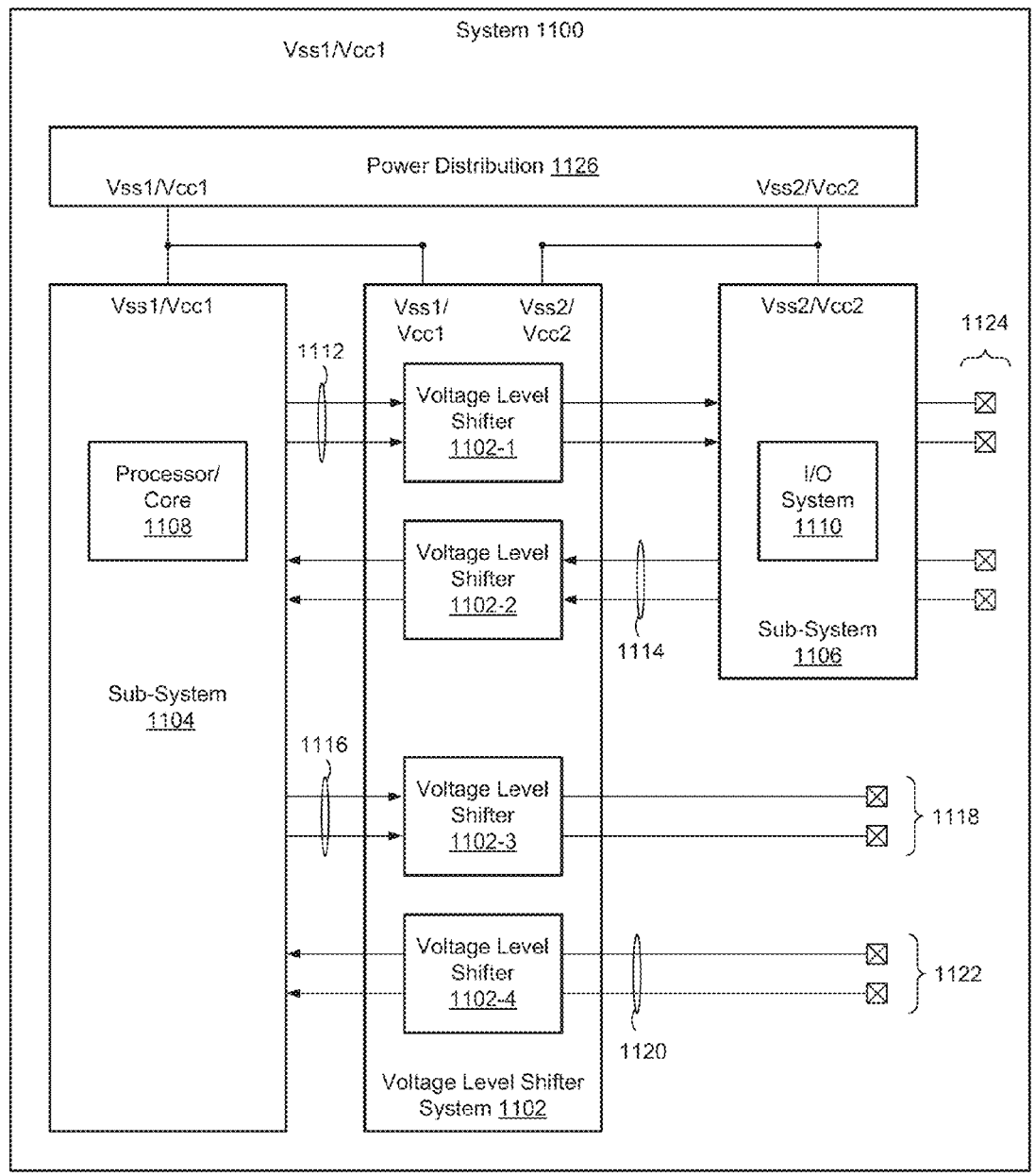

FIG. 11 is a block diagram of a system, including first and second sub-systems and a voltage level shifter system to translate between voltage domains of the first and second sub-systems.

Figure 12:
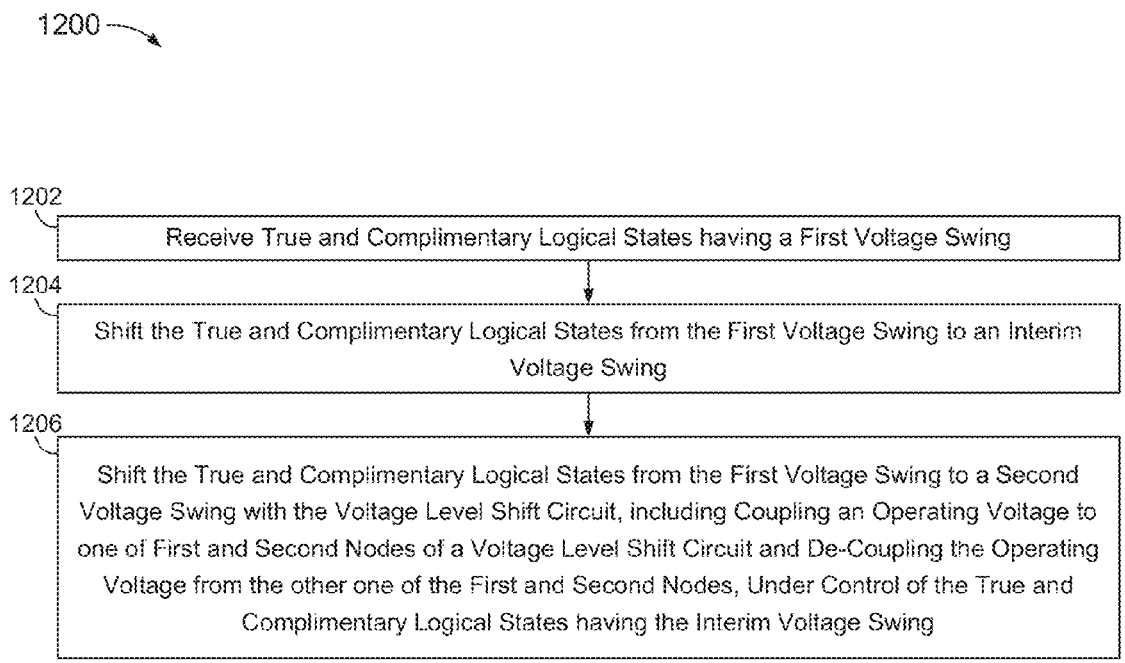

FIG. 12 is flowchart of a method of level shifting logical states from an input voltage swing to an output voltage swing, including controllably interrupting contention with logical states having an interim voltage swing.

In the drawings, the leftmost digit(s) of a reference number identifies the drawing in which the reference number first appears.

DETAILED DESCRIPTION

Figure 1:
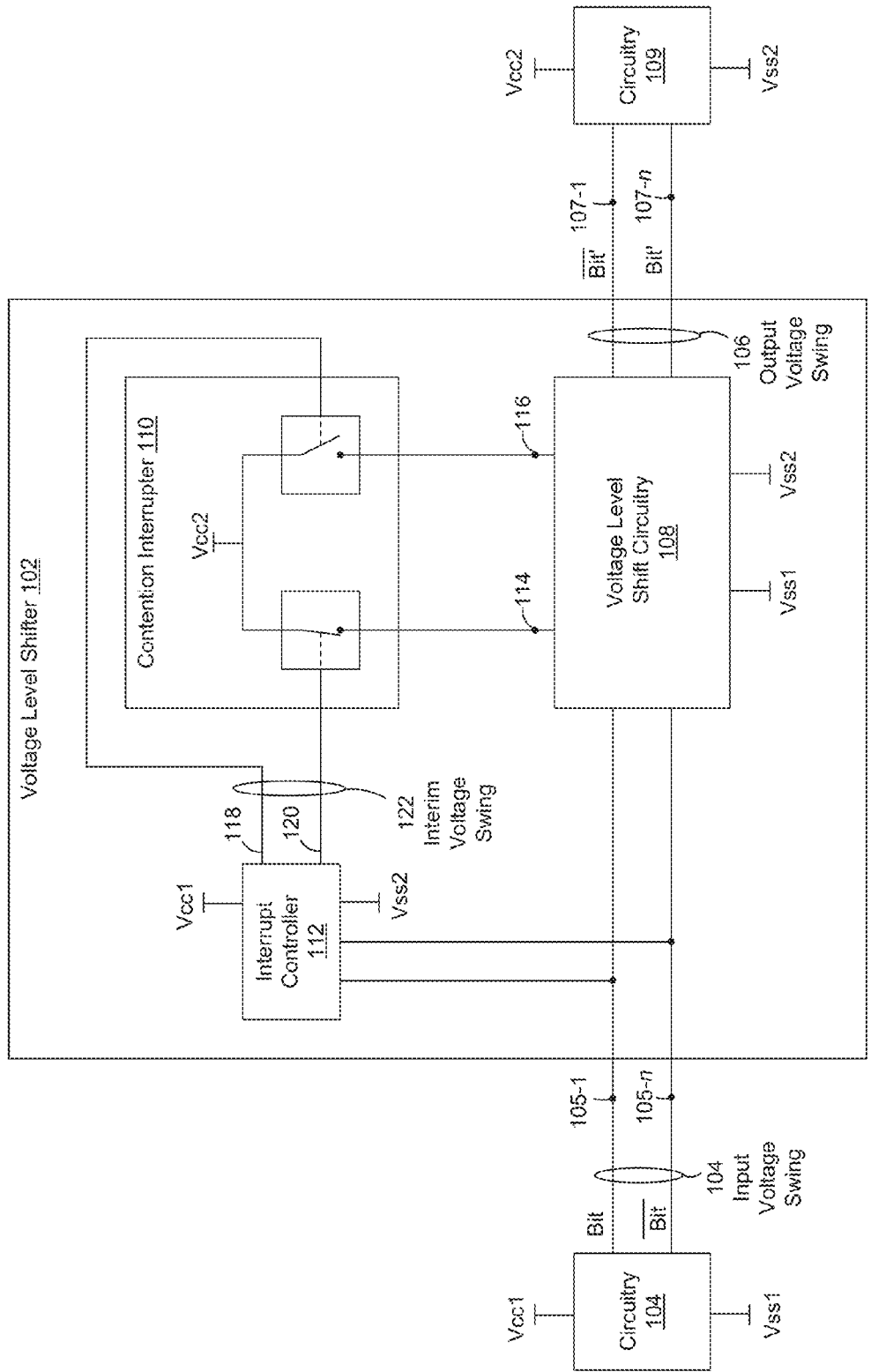

FIG. 1 is a block diagram of a voltage level shifter 102 to receive and translate input logical states having an input voltage, swing 104, to output logical states having an output voltage swing 106.

Voltage level shifter 102 may include one or more input nodes 105 to receive one or more input logical states, and one or more output nodes 107 to provide one or more corresponding voltage-level-shifted output logical states.

Voltage level shifter 102 may be implemented to level shift true and complementary logical states, also referred to herein as opposing logical states, and illustrated here as Bit and $\overline{\text{Bit}}$.

Voltage level shifter 102 may include voltage level shift circuitry 108 to translate Bit and $\overline{\text{Bit}}$, from an input voltage swing 104, to Bit' and $\overline{\text{Bit}}$', having output voltage swing 106.

Lower and upper limits of input voltage swing 104 may correspond to Vss1 and Vcc1, respectively, of circuitry 104, which may correspond to logical 0 and logical 1, respectively, in the voltage domain of circuitry 104.

Lower and upper limits of output voltage swing 106 may correspond to Vss2 and Vcc2, respectively, of circuitry 109, which may correspond to logical 0 and logic 1, respectively, in the voltage domain of circuitry 109.

Voltage level shift circuitry 108 may include contention circuitry, and may include a type or family of logic referred herein to as cascode voltage switch logic (CVSL), which may be implemented as differential cascode voltage switch logic (DCVSL). CVSL and/or DCVSL may include CMOS-type logic. In a CVSL and/or DCVSL circuit, logic may be implemented predominantly with N-channel MOSFET transistors. A DCVSL circuit may include true and complementary input nodes to receive opposing logical states, such as Bit and $\overline{\text{Bit}}$. A DCVSL circuit may include a pair of p-channel or p-type transistors, each to pull-up a corresponding output node associated with one of true and complimentary circuitry, depending on logical states of Bit' and $\overline{\text{Bit}}$'.

Figure 2:
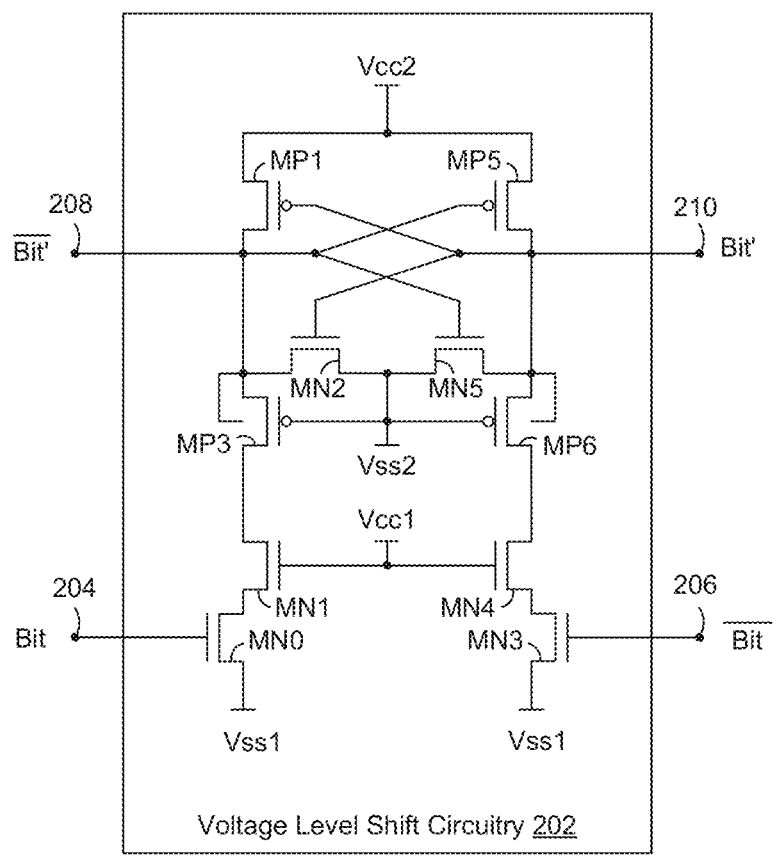
FIG. 2 is a circuit diagram of differential cascode voltage switch logic (DCVSL) based voltage level circuitry, which may be implemented as the voltage level shift circuitry of FIG. 1.

FIG. 2 is a circuit diagram of DCVSL-based voltage level circuitry 202, including true and complimentary input nodes 204 and 206, respectively, each to receive a corresponding one of Bit and $\overline{\text{Bit}}$.

When Bit transitions from Vss1 to Vcc1 at input node 204, or from 0 to logical 1 with respect to an input voltage domain, NMOS device MN0 turns on and contends with PMOS device MP1 to pull-down output node 208 towards Vss1. When output node 208 falls to Vss2, PMOS device MP3 turns off and NMOS device MN2 holds output node 208 at Vss2, or logical 0 with respect to output voltage domain.

Correspondingly, $\overline{\text{Bit}}$ transitions from Vcc1 to Vss1 at input node 206, or from logical 1 to logical 0, and NMOS device MN3 turns off. With NMOS device MN3 turned off and output node 208 at Vss2, PMOS device MP5 turns on and output node 210 is pulled up to Vcc2, or logical 1.

Conversely, when $\overline{\text{Bit}}$ transitions from Vss1 to Vcc1 at input node 206, or from logical 0 to logical 1, NMOS device MN3 turns on and contends with PMOS device MP5 to pull-down output node 210 towards Vss1. When output node 210 falls to Vss2, PMOS device MP6 turns off and NMOS device MN5 holds output node 210 at Vss2.

Correspondingly, Bit transitions from Vcc1 to Vss1 at input node 204, or from logical 1 to logical 0, and NMOS device MN0 turns off With NMOS device MN0 turned off and output node 210 at Vss2, PMOS device MP1 turns on and output node 208 is pulled up to Vcc2, or logical 1.

NMOS devices MN1, MN4, MP3, MP6 may serve as bias transistors to maintain voltages across transistor nodes of voltage level shift circuitry 202 within tolerance levels, and/or to maintain a desired voltage swing of Bit' and $\overline{\text{Bit}}$' at output nodes 208 and 210.

Transistors of voltage level shift circuitry 202 may be sized relative to one another to provide suitable contention. For example, transistors MP1 and MN0 may be sized relative to one another, and transistors MP5 and MN3 may be sized relative to one another.

Transistors MP1 and MP5 may be increased in size to provide suitable performance across adverse or worst case operating conditions, and/or to increase tolerance to random variations. Increasing sizes of MP1 and MP5 may, however, increase delay, power consumption, area, and/or scalability with respect to process technologies. Increasing sizes of one or more other transistors may reduce delay.

As an alternative to increasing sizes of transistors MP1 and MP5, or in addition to increasing sizes of transistors MP1 and MP5, voltage level shifter 102 in FIG. 1 may include a contention interrupter 110 to reduce contention within voltage level shift circuit 108. Contention interrupter 110 may be controllable to interrupt an operating voltage, illustrated here as Vcc2, to one of first and second nodes 114 and 116 of voltage level shifter 108, based on logical states of controls 118 and 120.

Contention interrupter 110 may be implemented with respect to voltage level shift circuitry 202 of FIG. 2, such as described below with reference to FIG. 3.

Figure 3:
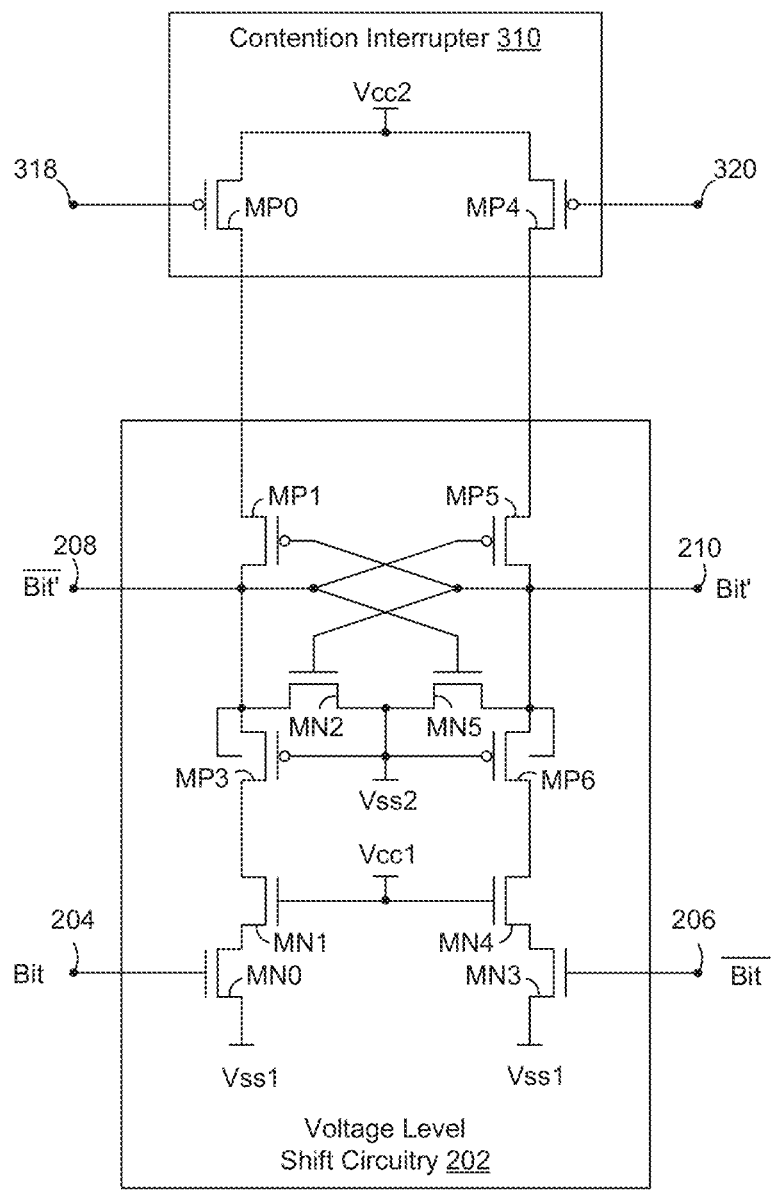
FIG. 3 is a circuit diagram of the voltage level shift circuitry of FIG. 2 and a contention interrupter.

FIG. 3 is a circuit diagram of voltage level shift circuitry 202 and a contention interrupter 310, together referred to herein as an interruptible voltage level shifter.

Contention interrupter 310 includes first and second PMOS devices MP0 and MP4, each to couple Vcc2 to a corresponding one of PMOS devices MP1 and MP5 of voltage level shift circuitry 202.

PMOS device MP0 may be controlled to interrupt Vcc2 to MP1 when Bit transitions from logical 0 to logical 1. This may reduce contention between PMOS device MP1 and NMOS device MN0 to assist in transitioning $\overline{\text{Bit}}$' from logical 1 to logical 0 at node 208.

PMOS device MP4 may be controlled to interrupt Vcc2 to MP5 when $\overline{\text{Bit}}$ transitions from logical 0 to logical 1. This may reduce contention between MP5 and MN3 to assist in transitioning Bit' from logical 1 to logical 0 at node 210.

Contention interrupter 310 may receive controls 318 and 320 to control corresponding ones of transistors MP0 and MP4. Logical states of controls 318 and 320 may correspond to logical states of Bit and $\overline{\text{Bit}}$, respectively.

Bit and $\overline{\text{Bit}}$ may be applied directly as controls 320 and 318, respectively, provided that process-based voltage reliability limits of MP0 and MP4 are not exceeded in view of input voltage swing 104 in FIG. 1.

Alternatively, in FIG. 1, voltage level shifter 208 may include an interrupt controller 112 to provide first and second controls 118 and 120 to contention interrupt controller 110. Controls 118 and 120 may correspond to controls 318 and 320, respectively, in FIG. 3.

Interrupt controller 112 may be implemented to provide first and second controls 118 and 120 with an interim voltage swing 122 that does exceed process-based voltage reliability limits of contention interrupter 110.

A process-based voltage reliability limit may be defined or specified to prevent oxide breakdown and/or other transistor defect. A process-based voltage reliability limit may be defined or specified in terms of, for example and without limitation, a gate-to-source voltage or a drain-to-source voltage.

In FIG. 1, lower and upper limits of interim voltage swing 122 may correspond to Vss2 and Vcc1, respectively, or the lower limit of output voltage swing 106 and the upper limit of input voltage swing 104. Methods and systems disclosed herein are not, however, limited to these examples.

Interrupt controller 112 may be implemented to generate first and second controls 118 and 120 from Bit and $\overline{\text{Bit}}$, and may be implemented to level shift Bit and $\overline{\text{Bit}}$ from input voltage swing 204 to interim voltage swing 122, such as described in one or more examples below.

Figure 4:
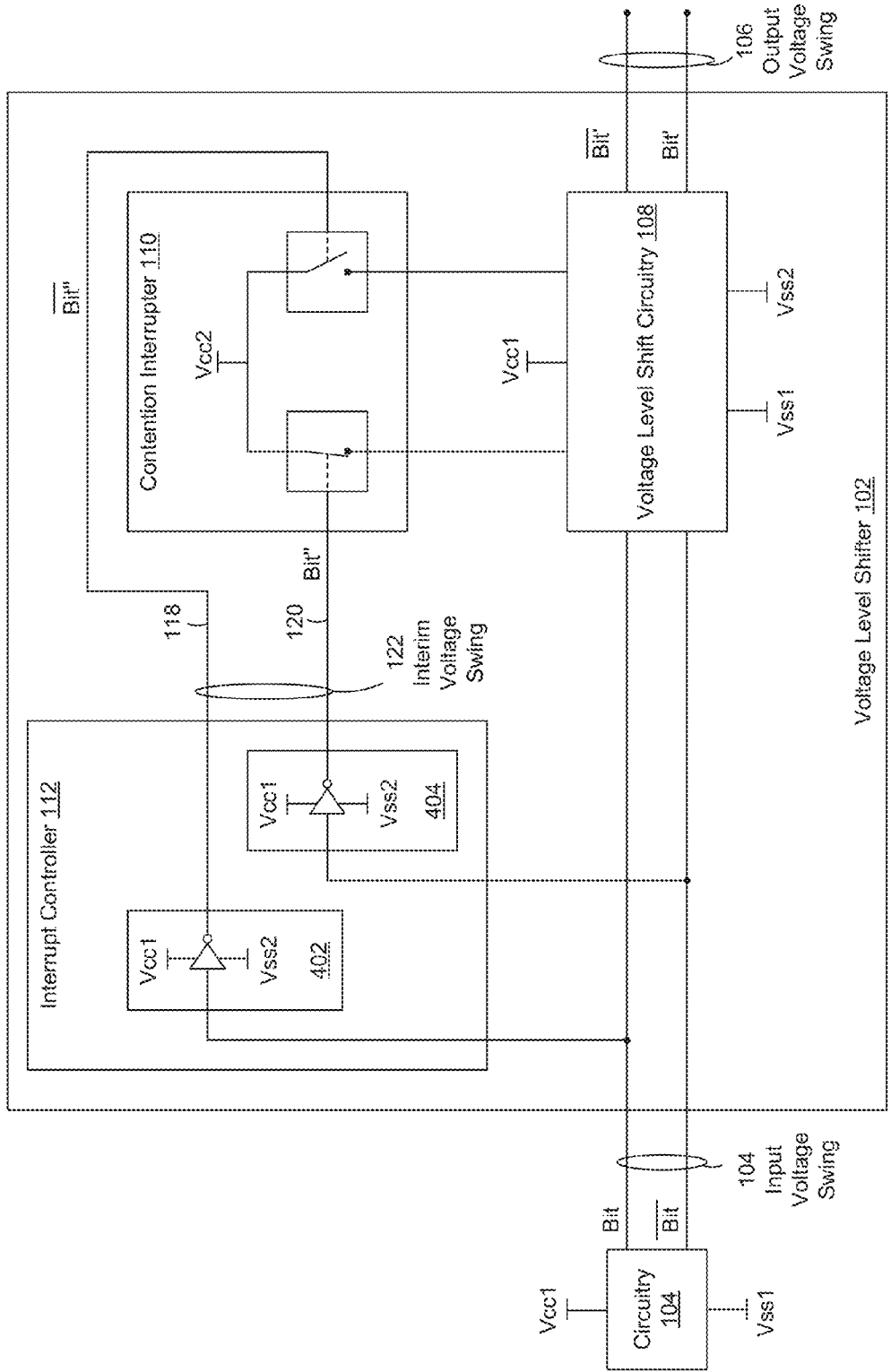
FIG. 4 is a block diagram of the voltage level shifter of FIG. 1, where the interrupt controller includes first and second buffers, each to pull-up or pull-down a corresponding one of the input true and complimentary logical states to one of a lower limit and an upper limit of the interim voltage swing based on the input logical states.

FIG. 4 is a block diagram of voltage level shifter 102, where interrupt controller 112 includes first and second buffers 402 and 404, each to pull-up or pull-down a corresponding one controls 118 and 120 to Vcc1 to Vss2, depending upon states of Bit and $\overline{\text{Bit}}$.

Buffers 402 and 404 may each include an inverter, and controls 118 and 120 may be referred to as $\overline{\text{Bit}}$" and Bit", respectively.

Buffers 402 and 404 may be implemented to impart relatively little delay to controls 118 and 120 through interrupt controller 112. Delay may be, for example, one gate stage delay, such as described below with reference to FIG. 5.

FIG. 5 is a circuit diagram of an interrupt controller 512, including first and second inverters 502 and 504, each to invert a corresponding one of Bit and $\overline{\text{Bit}}$, and output a corresponding one of $\overline{\text{Bit}}$" and Bit" with a voltage swing of Vcc1 to Vss2.

In FIG. 5, inverter 502 includes a PMOS device MP7 and an NMOS device MN6. Similarly, inverter 504 includes a PMOS device MP9 and an NMOS device MN7, When Bit transitions from logical 0 to logical 1, MP7 turns off and MN6 turns on to assert Vss2, or logical 0 as $\overline{\text{Bit}}$". Correspondingly, Bit transitions from logical 1 to logical 0, MN7 turns off, and MP9 turns on to assert or output Vcc1, or logical 1 as Bit".

FIG. 6 is a circuit diagram of an interrupt controller 612, including first and second inverters 602 and 604, each similar to a corresponding one of first and second inverters 502 and 504 in FIG. 5, each further including an additional PMOS device MP8 and MP10, respectively.

PMOS devices MP8 and MP10 may provide additional drive, or Vgs-Vt overdrive, to assist a corresponding one of NMOS devices MN6 and MN7 in asserting Vss2. For example, with respect to inverter 602, when Bit transitions from logical 0 to logical 1, NMOS device MN6 turns on and pulls-down $\overline{\text{Bit}}$" to Vss2. Correspondingly, $\overline{\text{Bit}}$ transitions from logical 1 to logical 0 and turns on PMOS device MP8 to assist NMOS device MN6 in pulling-down $\overline{\text{Bit}}''$ to Vss2. PMOS devices MP8 and MP10 may be useful to help ensure that Bit'' and $\overline{\text{Bit}}''$ transition substantially simultaneously with respect to one another.

In FIG. 4, voltage level shifter 102 receives multiple voltage levels, illustrated here as including Vss1, Vcc1, Vss2, and Vcc2. The multiple voltage levels may have different turn-on times and/or ramp-up rates, which may lead to short-circuit current consumption. Voltage level shifter 102 may include power-on circuitry to control application of one or more voltages within voltage level shifter 102, such as described below with reference to FIG. 7.

FIG. 7 is a circuit diagram of interrupt controller 612 and power-on control circuitry 702 to control application of Vss2 to interrupt controller 612. In the example of FIG. 7, application of Vss2 is delayed until Vcc1 and Vss2 reach turn-on threshold levels of corresponding inverters 704 and 706. Power-on control circuitry 702 may help to avoid short circuit current consumption between Vcc1 and Vss2 during power-on and/or ramp-up.

A voltage level shifter as disclosed herein may be controllable to operate in one of multiple selectable modes, which may include a level-shifting mode and a non-level shifting mode. In a level-shifting mode, an input voltage swing, an interim voltage swing, and an output voltage swing may differ from one another, such as described below with reference to FIG. 8. In a non-level-shifting mode, an input voltage swing, an interim voltage swing, and an output voltage swing may be equal to one another, such as described below with reference to FIG. 10.

FIG. 8 is a circuit diagram of a voltage level shifter 802, including features described with respect to one of more of FIGS. 1 and 7, and example voltage levels and voltage swings for a level-shifting mode.

FIG. 9 is a chart to illustrate the example voltages and voltage swings of FIG. 8.

Table 1 lists the example voltages and voltage swings of FIG. 8.

The example voltage levels and voltage swings of FIGS. 8 and 9, and Table 1, are provided for illustrative purposes. Methods and systems disclosed herein are not limited to the example voltage levels and voltage swings of FIG. 8, 9, or Table 1.

TABLE 1

| Voltage Swing | Lower Limit Voltage | Upper Limit Voltage |
| --- | --- | --- |
| Input voltage swing 104 | Vss1 = 0 Volts | Vcc1 = 1.8 Volts |
| Interim Voltage Swing 122 | Vss2 = 1.2 Volts | Vcc1 = 1.8 Volts |
| Output voltage swing 106 | Vss2 = 1.2 Volts | Vcc2 = 2.85 Volts |

FIG. 10 is a circuit diagram of a voltage level shifter 1002, including features described with respect to one of more of FIGS. 1 through 7, and example voltage levels and voltage swings for a non-level-shifting mode.

Table 2 lists the example voltages and voltage swings of FIG. 10.

TABLE 2

| Voltage Swing | Lower Limit Voltage | Upper Limit Voltage |
| --- | --- | --- |
| Input voltage swing 104 | Vss1 = 0 Volts | Vcc1 = 1.8 Volts |
| Interim Voltage Swing 122 | Vss2 = 0 Volts | Vcc1 = 1.8 Volts |
| Output voltage swing 106 | Vss2 = 0 Volts | Vcc2 = 1.8 Volts |

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages. The terms software, code, and instructions, as used herein, may refer to a computer program product including a computer readable medium having computer program logic stored therein, with instructions to cause a computer system to perform one or more functions in response thereto. The computer readable medium may include a transitory and/or non-transitory medium.

A voltage level shifter as disclosed herein may be implemented with a CMOS process technology.

A voltage level shifter as disclosed herein may be implemented as an interruptible high voltage tolerant level shifter to impart a relatively large voltage level shift while maintaining voltages within process-based voltage reliability limits of a contention interrupt circuit.

A voltage level shifter as disclosed herein may be implemented within an integrated circuit (IC) die, alone and/or in combination with other circuitry, such as described below with reference to FIG. 11.

FIG. 11 is a block diagram of a system 1100, including first and second sub-systems 1104 and 1106, respectively.

Sub-system 1104 may include, for example and without limitation, logic, circuitry, one or more processors/cores 1108, and/or combinations thereof.

Similarly, sub-system 1106 may include logic, circuitry, one or more processors/cores, and/or combinations thereof.

Sub-system 11011 may include, for example, an input/output (I/O) system 1110 to interface between sub-system 1104 and one or more systems external to system 1100. I/O system 1110 may represent a general purpose I/O (GPIO) system.

System 1100 may include a voltage level shifter system 1102 to translate data between a first voltage domain Vss1/Vcc1 of sub-system 1104, and a second voltage domain Vss2/Vcc2 of sub-system 1106.

Voltage level shifter system 1102 may include a voltage level shifter 1102-1 to translate data 1112 from the first voltage domain to the second voltage domain.

Level shifter system 1102 may include a voltage level shifter 1102-2 to translate data 1114 from the second voltage domain to the first voltage domain.

Voltage level shifter system 1102 may include a voltage level shifter 1102-3 to translate data 1116 from the first voltage domain to another voltage domain for output at terminals or pads 1118.

Voltage level shifter system 1102 may include a voltage level shifter 1102-4 to translate data 1120 received at pads 1122, from another voltage domain to the first voltage domain.

One or more of voltage levels shifters 1102-1 through 1102-4 may be implemented as described in one or more examples herein.

System 1100 may be implemented across multiple integrated circuit (IC) dies or chips and/or within a single IC die. System 1100 may represent a system-on-a-chip (SoC).

System 1100 may be implemented to communicate with one or more systems directly and/or through a communication network and/or over a wired and/or wireless communication link.

For example, sub-system 1106 may include a transmitter system or a portion thereof, which may include one or more of a signal processor, an encoder, a modulator, a frequency up-converter, and a power amplifier.

Sub-system 1106 may include a receiver system or a portion thereof, which may include one or more of low noise amplifier, a frequency down-converter, a demodulator, a decoder, and a signal processor.

System 1100 may further include terminals or pads 1124 to couple to a cable system and/or an antenna system.

System 1100 may include a power distribution system 1126 to provide voltages to sub-systems 1104 and 1106 and voltage level shifter system 1102. Power distribution system 1126 and/or an associated voltage regulator may be configurable with respect to voltage levels of Vss1/Vcc1 and Vss2/Vcc2, to accommodate various input and/or output voltage swings. Power distribution system 1126 and/or an associated voltage regulator may be configurable with respect to voltage levels of Vss1/Vcc1 and Vss2/Vcc2, to provide one or more level-shifting mode and/or a non-level shift mode.

System 1100 may include one or more additional sub-systems, which may operate in one or more other voltage domains, and may include one or more additional corresponding voltage level shifter systems.

FIG. 12 is flowchart of a method 1200 of level shifting logical states from an input voltage swing to an output voltage swing, including controllably interrupting contention with logical states having an interim voltage swing.

At 1202, true and complimentary logical states are received. The true and complimentary logical states may correspond to Bit and $\overline{Bit}$ in one or more examples herein, and may have an input voltage swing.

At 1204, the true and complimentary logical states are converted from the input voltage swing to an interim voltage swing, such as described with respect to controls 118 and 120, controls 318 and 320, and/or Bit" and $\overline{Bit}$", in one or more examples herein.

The interim voltage swing may correspond to, or be defined by a lower limit of the output voltage swing and an upper limit of the input voltage swing. Method 1200 is not, however, limited to these examples.

At 1206, the true and complimentary logical states are converted, or from the input voltage swing to the output second voltage swing.

The level-shifting at 1206 may include coupling an operating voltage to one of first and second nodes of a voltage level shift circuit, and de-coupling the operating voltage from the other one of the first and second nodes, under control of the true and complementary logical states having the interim voltage swing, such as described with respect to contention interrupter 110 and/or 310 in one or more examples herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages. The terms software, code, and instructions, as used herein, may refer to a computer program product including a computer readable medium having computer program logic stored therein, with instructions to cause a computer system to perform one or more functions in response thereto. The computer readable medium may include a transitory and/or non-transitory medium.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. A system, comprising:
    a voltage level shift circuit to shift input logical states from an input voltage swing to an output voltage swing;
    a controllable contention interrupter to selectively interrupt contention within the voltage level shift circuit; and
    an interrupt controller to shift the input logical states from the input voltage swing to an interim voltage swing, and control the contention interrupter with the logical states having the interim voltage swing;
    wherein a lower limit of the interim voltage swing is equal to a lower limit of the output voltage swing; and
    wherein an upper limit of the interim voltage swing is equal to an upper limit of the input voltage swing.

2. The system of claim 1, wherein:
    the interrupt controller is configured to shift the input logical states to an interim voltage swing that is within a process-based voltage reliability limit of the contention interrupter.

3. The system of claim 1, further including:
    power-on control circuitry to delay application of the lower limit of the output voltage swing to the interrupt controller until the upper limit of the input voltage swing is applied to the interrupt controller.

4. The system of claim 1, wherein:
    the interrupt controller includes a buffer to output a logical state at one of the lower limit and the upper limit of the interim voltage swing based upon a corresponding input logical state.

5. The system of claim 1, wherein:
    the voltage level shift circuit, the contention interrupter, and the interrupt controller each include true and complimentary logical state paths; and
    the interrupt controller includes first and second inverters, each to output an inverted one of true and complimentary logical states at a corresponding one of the lower limit and the upper limit of the interim voltage swing.

6. An integrated circuit (IC) die, comprising:
    a first sub-system to output logical states with a first voltage swing;
    a second sub-system to process logical states with a second voltage swing;
    a voltage level shift circuit to shift the logical state from the first voltage swing to the second voltage swing;
    a controllable contention interrupter to selectively interrupt contention within the voltage level shift circuit; and
    an interrupt controller to shift the input logical states from the input voltage swing to an interim voltage swing, and control the contention interrupter with the logical states having the interim voltage swing;
    wherein a lower limit of the interim voltage swing is equal to a lower limit of the second voltage swing; and
    wherein an upper limit of the interim voltage swing is equal to an upper limit of the first voltage swing.

7. The IC die of claim 6, wherein:
the interrupt controller is configured to shift the input logical states to an interim voltage swing that is within a process-based voltage reliability limit of the contention interrupter.

8. The IC die of claim 6, further including:
power-on control circuitry to delay application of the lower limit of the second voltage swing to the interrupt controller until the upper limit of the first voltage swing is applied to the interrupt controller.

9. The IC die of claim 6, wherein:
the interrupt controller includes a buffer to output a logical state at one of the lower limit and the upper limit of the interim voltage swing based upon a corresponding input logical state.

10. The IC die of claim 6, wherein:
the voltage level shift circuit, the contention interrupter, and the interrupt controller each include true and complimentary logical state paths; and
the interrupt controller includes first and second inverters, each to output an inverted one of true and complimentary logical states at a corresponding one of the lower limit and the upper limit of the interim voltage swing.

11. The IC die of claim 6, further including:
a power control system to operate the voltage level shift circuit, the contention interrupter, and the interrupt controller in a selectable one of a level-shift mode and a non-level-shift mode;
wherein the first voltage swing, the interim voltage swing, and the second voltage swing differ from one another in the level-shift mode; and
wherein the first voltage swing, the interim voltage swing, and the second voltage swing are equal to one another in the non-level-shift mode.

12. A method, comprising:
receiving input logical states having an input voltage swing;
shifting the input logical states from the input voltage swing to an interim voltage swing; and
shifting the input logical states from the input voltage swing to an output voltage swing with a voltage level shift circuit, including selectively interrupting an operating voltage to the voltage level shift circuit under control of the logical states having the interim voltage swing;
wherein a lower limit of the interim voltage swing is equal to a lower limit of the output voltage swing; and
wherein an upper limit of the interim voltage swing is equal to an upper limit of the input voltage swing.

13. The method of claim 12, wherein the interrupting is performed with a contention interrupter, and wherein;
the shifting includes shifting the input logical states to an interim voltage swing that is within a process-based voltage reliability limit of the contention interrupter.

14. The method of claim 12, wherein the shifting of the input logical states from the input voltage swing to the interim voltage swing is performed with an interrupt controller, the method further including:
delaying application of the lower limit of the output voltage swing to the interrupt controller until the upper limit of the input voltage swing is applied to the interrupt controller.

15. The method of claim 12, wherein the shifting the input logical states from the input voltage swing to an interim voltage swing includes:
outputting one of the lower limit and the upper limit of the interim voltage swing based upon a corresponding input logical state.

16. The method of claim 12, wherein:
the shifting of the input logical states from the input voltage swing to the interim voltage swing, and the shifting of the input logical state from the input voltage swing to the output voltage swing, are performed with respect to true and complimentary input logical states: and
the shifting of the input logical states from the input voltage swing to the interim voltage swing further includes inverting the true and complimentary input logical states to corresponding ones of the lower limit and the upper limit of the interim voltage swing.

17. The method of claim 12, further including:
selectively operating in one of a level-shift mode and a non-level-shift mode;
wherein the first voltage swing, the interim voltage swing, and the second voltage swing differ from one another in the level-shift mode; and
wherein the first voltage swing, the interim voltage swing, and the second voltage swing are equal to one another in the non-level-shift mode.

* * * * *